(12) United States Patent
Oganesian et al.

(10) Patent No.: US 9,893,213 B2
(45) Date of Patent: Feb. 13, 2018

(54) METHOD OF FORMING A WIRE BOND SENSOR PACKAGE

(71) Applicant: Optiz, Inc., Palo Alto, CA (US)

(72) Inventors: Vage Oganesian, Sunnyvale, CA (US); Zhenhua Lu, Suzhou (CN)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 15/492,592

(22) Filed: Apr. 20, 2017

(65) Prior Publication Data
US 2017/0222065 A1  Aug. 3, 2017

Related U.S. Application Data

(62) Division of application No. 14/809,921, filed on Jul. 27, 2015, now Pat. No. 9,666,730.

(60) Provisional application No. 62/038,429, filed on Aug. 18, 2014.

(51) Int. Cl.
*H01L 31/02* (2006.01)
*H01L 27/146* (2006.01)
*H01L 31/0203* (2014.01)

(52) U.S. Cl.
CPC .. *H01L 31/02002* (2013.01); *H01L 27/14618* (2013.01); *H01L 27/14636* (2013.01); *H01L 27/14683* (2013.01); *H01L 31/0203* (2013.01)

(58) Field of Classification Search
CPC ............... H01L 31/02; H01L 31/02002; H01L 327/146; H01L 27/4636; H01L 27/14632; H01L 25/0657; H01L 25/043; H01L 25/0655
See application file for complete search history.

(56) References Cited

U.S. PATENT DOCUMENTS

| | | |
|---|---|---|
| 6,649,991 B1 | 11/2003 | Chen |
| 6,661,084 B1 | 12/2003 | Peterson |
| 6,777,767 B2 | 8/2004 | Badchi |
| 6,972,480 B2 | 12/2005 | Zilber et al. |
| 7,033,664 B2 | 4/2006 | Zilber et al. |

(Continued)

FOREIGN PATENT DOCUMENTS

| | | |
|---|---|---|
| JP | H02-16670 A | 2/1990 |
| JP | H05-14815 A | 1/1993 |

(Continued)

*Primary Examiner* — Phuc Dang
(74) *Attorney, Agent, or Firm* — DLA Piper LLP (US)

(57) ABSTRACT

A packaged chip assembly with a semiconductor substrate, a semiconductor device integrally formed on or in the substrate's top surface, and first bond pads at the substrate's top surface electrically coupled to the semiconductor device. A second substrate includes a first aperture and one or more second apertures extending therethrough, second and third bond pads at the second substrate's top and bottom surfaces, respectively, and conductors electrically coupled to the second and third bond pads. The semiconductor substrate's top surface is secured to the second substrate's bottom surface such that the semiconductor device is aligned with the first aperture, and each of the first bond pads is aligned with one of the second apertures. A plurality of wires are each electrically connected between one of the first bond pads and one of the second bond pads and each passing through one of the one or more second apertures.

8 Claims, 29 Drawing Sheets

(56) References Cited

U.S. PATENT DOCUMENTS

| | | | |
|---|---|---|---|
| 7,157,742 B2 | 1/2007 | Badehi | |
| 7,192,796 B2 | 3/2007 | Zilber et al. | |
| 7,265,440 B2 | 9/2007 | Zilber et al. | |
| 7,456,901 B2 | 11/2008 | Jeong et al. | |
| 7,495,341 B2 | 2/2009 | Zilber et al. | |
| 7,569,409 B2 | 8/2009 | Lin et al. | |
| 7,589,422 B2 | 9/2009 | Lee et al. | |
| 7,642,629 B2 | 1/2010 | Zilber et al. | |
| 7,664,390 B2 | 2/2010 | Cho et al. | |
| 7,723,146 B2 | 5/2010 | Chow | |
| 7,859,033 B2 | 12/2010 | Brady | |
| 8,237,256 B2 | 8/2012 | Verjus | |
| 8,253,231 B2* | 8/2012 | Sutardja | H01L 23/13 257/686 |
| 8,432,011 B1 | 4/2013 | Oganesian | |
| 8,513,756 B2 | 8/2013 | Suzuki et al. | |
| 8,546,900 B2 | 10/2013 | Oganesian | |
| 8,546,951 B2 | 10/2013 | Oganesian | |
| 8,552,518 B2 | 10/2013 | Oganesian | |
| 8,570,669 B2 | 10/2013 | Oganesian | |
| 8,604,576 B2 | 12/2013 | Oganesian | |
| 8,642,393 B1* | 2/2014 | Yu | H01L 24/05 257/678 |
| 8,692,344 B2 | 4/2014 | Oganesian | |
| 8,759,930 B2 | 6/2014 | Oganesian | |
| 8,796,800 B2 | 8/2014 | Oganesian | |
| 8,921,759 B2 | 12/2014 | Oganesian | |
| 8,987,886 B2 | 3/2015 | Rathburn | |
| 9,018,725 B2 | 4/2015 | Oganesian | |
| 9,196,980 B2 | 11/2015 | Rathburn | |
| 9,233,511 B2 | 1/2016 | Oganesian | |
| 2003/0107047 A1* | 6/2003 | Okuyama | H01L 33/007 257/95 |
| 2004/0129991 A1* | 7/2004 | Lai | H01L 31/0203 257/433 |
| 2004/0251525 A1 | 12/2004 | Zilber | |
| 2005/0003649 A1 | 1/2005 | Takao | |
| 2005/0104179 A1 | 5/2005 | Zilber | |
| 2005/0205977 A1 | 9/2005 | Zilber | |
| 2006/0073635 A1 | 4/2006 | Su | |
| 2006/0186528 A1 | 8/2006 | Sasaki | |
| 2007/0029654 A1 | 2/2007 | Sunohara | |
| 2007/0138498 A1 | 6/2007 | Zilber | |
| 2007/0190691 A1 | 8/2007 | Humpston | |
| 2007/0190747 A1 | 8/2007 | Humpston | |
| 2008/0012115 A1 | 1/2008 | Zilber | |
| 2008/0017879 A1 | 1/2008 | Zilber | |
| 2008/0048308 A1 | 2/2008 | Lam | |
| 2008/0083976 A1 | 4/2008 | Haba | |
| 2008/0083977 A1 | 4/2008 | Haba | |
| 2008/0099900 A1 | 5/2008 | Oganesian | |
| 2008/0099907 A1 | 5/2008 | Oganesian | |
| 2008/0116544 A1 | 5/2008 | Grinman | |
| 2008/0116545 A1 | 5/2008 | Grinman | |
| 2008/0150121 A1 | 6/2008 | Oganesian | |
| 2008/0185671 A1 | 8/2008 | Huang et al. | |
| 2008/0246136 A1 | 10/2008 | Haba et al. | |
| 2008/0265350 A1 | 10/2008 | Wu et al. | |
| 2009/0026567 A1 | 1/2009 | Chen et al. | |
| 2009/0115047 A1 | 5/2009 | Haba | |
| 2009/0127686 A1 | 5/2009 | Yang | |
| 2009/0160065 A1 | 6/2009 | Haba | |
| 2009/0206455 A1* | 8/2009 | Harper | H01L 23/3128 257/659 |
| 2009/0212381 A1 | 8/2009 | Crisp | |
| 2010/0052130 A1 | 3/2010 | Hwang | |
| 2010/0053407 A1 | 3/2010 | Crisp | |
| 2010/0200898 A1 | 8/2010 | Lin et al. | |
| 2010/0225006 A1 | 9/2010 | Haba | |
| 2010/0230812 A1 | 9/2010 | Oganesian | |
| 2010/0237452 A1 | 9/2010 | Hagiwara et al. | |
| 2010/0244171 A1 | 9/2010 | Nagamatsu et al. | |
| 2010/0270657 A1 | 10/2010 | Song | |
| 2011/0012259 A1 | 1/2011 | Grinman | |
| 2011/0031629 A1 | 2/2011 | Haba | |
| 2011/0033979 A1 | 2/2011 | Haba | |
| 2011/0049696 A1 | 3/2011 | Haba | |
| 2011/0187007 A1 | 8/2011 | Haba | |
| 2012/0018863 A1 | 1/2012 | Oganesian | |
| 2012/0018868 A1 | 1/2012 | Oganesian | |
| 2012/0018893 A1 | 1/2012 | Oganesian | |
| 2012/0018894 A1 | 1/2012 | Oganesian | |
| 2012/0018895 A1 | 1/2012 | Oganesian | |
| 2012/0020026 A1 | 1/2012 | Oganesian | |
| 2012/0043635 A1 | 2/2012 | Yang | |
| 2012/0068327 A1 | 3/2012 | Oganesian | |
| 2012/0068330 A1 | 3/2012 | Oganesian | |
| 2012/0068351 A1 | 3/2012 | Oganesian | |
| 2012/0068352 A1 | 3/2012 | Oganesian | |
| 2013/0134585 A1* | 5/2013 | Stuber | H01L 23/49816 257/737 |
| 2013/0168791 A1 | 7/2013 | Oganesian | |
| 2013/0249031 A1 | 9/2013 | Oganesian | |
| 2013/0285263 A1* | 10/2013 | Arnold | H01L 24/11 257/780 |
| 2014/0027612 A1* | 1/2014 | Oganesian | H01L 27/14625 250/208.1 |
| 2014/0248736 A1 | 9/2014 | Oganesian | |
| 2014/0264691 A1 | 9/2014 | Oganesian et al. | |
| 2014/0361347 A1* | 12/2014 | Kao | H01L 27/14687 257/226 |
| 2015/0123289 A1 | 5/2015 | Park | |
| 2015/0255418 A1 | 9/2015 | Gowda | |

FOREIGN PATENT DOCUMENTS

| | | |
|---|---|---|
| JP | H09-146013 A | 6/1997 |
| JP | 2004-165191 | 6/2004 |
| JP | 2004-363400 A | 12/2004 |
| JP | 2005539403 A | 12/2005 |
| JP | 2007329813 | 12/2007 |
| JP | 2009-266862 A | 11/2009 |
| JP | 2010-171220 A | 8/2010 |
| JP | 2012059832 A | 3/2012 |
| JP | 2012-186235 A | 9/2012 |
| KR | 100377472 | 3/2003 |
| KR | 20040093361 | 11/2004 |
| KR | 20050032460 | 4/2005 |
| KR | 200406394 | 1/2006 |
| KR | 100775136 B1 | 11/2007 |
| KR | 1020110120429 A | 11/2011 |
| KR | 101142347 B1 | 7/2012 |
| KR | 10-2013-0010847 | 1/2013 |
| WO | 2013134159 A2 | 9/2013 |

\* cited by examiner

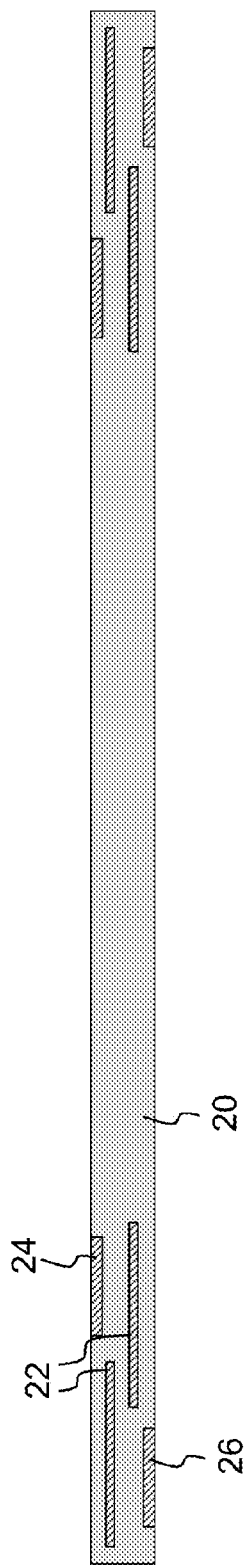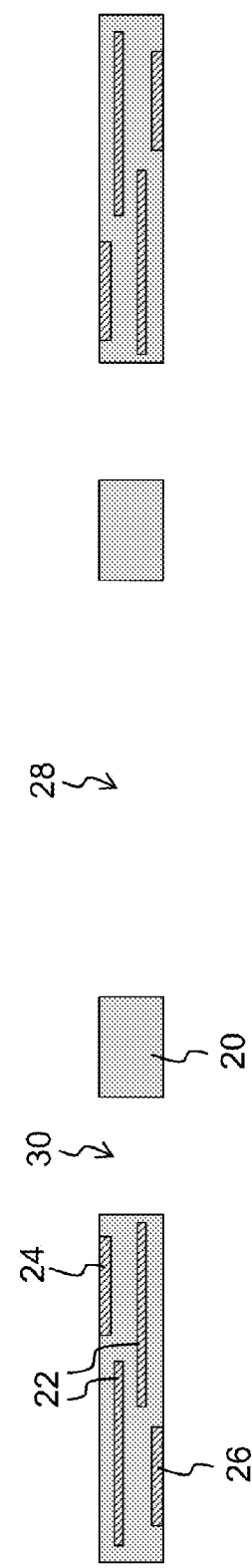

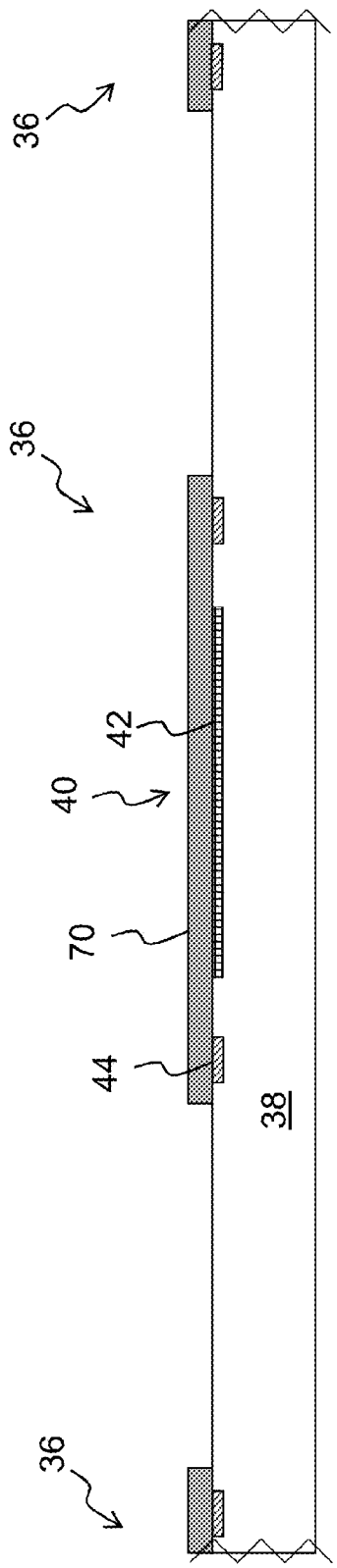

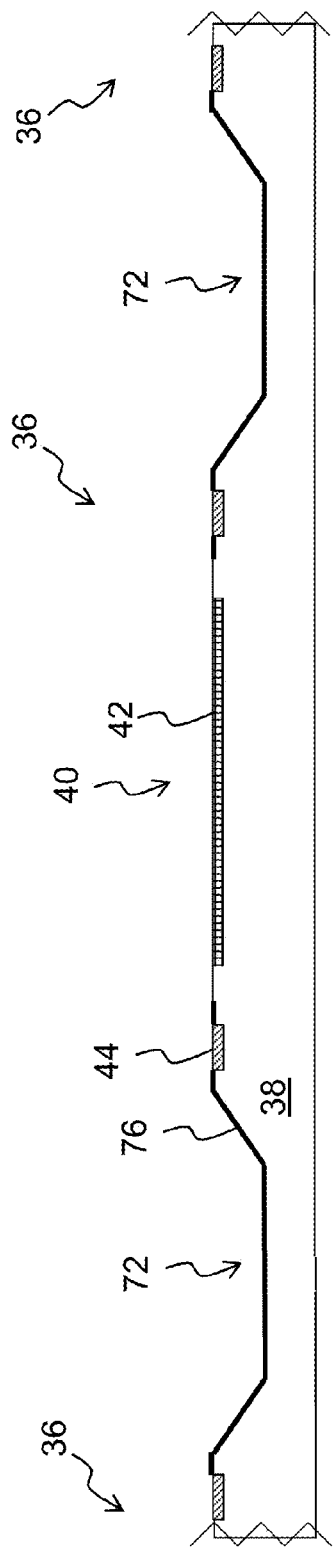

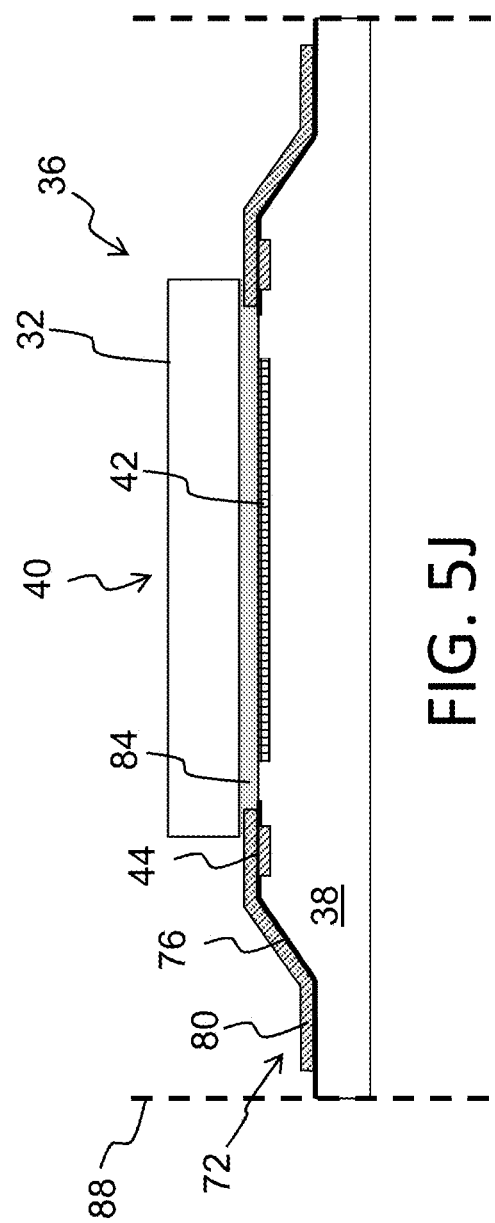

METHOD OF FORMING A WIRE BOND SENSOR PACKAGE

RELATED APPLICATIONS

This application is a divisional application of U.S. application Ser. No. 14/809,921, filed Jul. 27, 2015, which claims the benefit of U.S. Provisional Application No. 62/038,429, filed Aug. 18, 2014, and which is incorporated herein by reference.

FIELD OF THE INVENTION

The present invention relates to packaged integrated circuit (semiconductor) chips.

BACKGROUND OF THE INVENTION

An integrated circuit chip mounted on a substrate with the use of wire bonding to connect the integrated circuit chip to the substrate has been a staple practice in the chip packaging industry. As the consumer demand grows for more slim mobile devices, chip-packaging structures must also reduce in size, especially the package height, to meet the slim device trend.

A conventional packaging solution is disclosed in U.S. Published Application 2003/0201535, and is shown in FIG. 1. The package 1 includes an image sensor chip 2 bonded to an organic package substrate 3, where the chip 2 is electrically connected to the substrate 3 by bond wires 4. The bond wires 4 are encapsulated by resin 5 and then again by an encapsulant 6, while leaving the active area 7 of chip 2 exposed. The active area 7 is enclosed by a transparent element 8. The image sensor chip 2 is affixed to substrate 3 by adhesive 9. Off package electrical conductivity is achieved using solder balls 10.

The problem with this package configuration is that its size, and its height in particular, cannot be scaled down as desired.

BRIEF SUMMARY OF THE INVENTION

The aforementioned problems and needs are addressed by a method of forming a packaged chip assembly, which includes providing a semiconductor chip, providing a second substrate, securing them together, and electrically connecting them together. The semiconductor chip includes a first substrate of semiconductor material having first top and first bottom surfaces, a semiconductor device integrally formed on or in the first top surface, and first bond pads at the first top surface electrically coupled to the semiconductor device. The second substrate includes second top and second bottom surfaces, a first aperture extending between the second top and second bottom surfaces, one or more second apertures extending between the second top and second bottom surfaces, second bond pads at the second top surface, third bond pads at the second bottom surface, and conductors electrically coupled to the second bond pads and the third bond pads. The securing includes securing the first top surface to the second bottom surface such that the semiconductor device is aligned with the first aperture, and each of the first bond pads is aligned with one of the one or more second apertures. The electrically connecting includes electrically connecting each of a plurality of wires between one of the first bond pads and one of the second bond pads, wherein each of the plurality of wires passes through one of the one or more second apertures.

A method of forming a packaged chip assembly includes providing a semiconductor chip (which includes a first substrate of semiconductor material having first top and first bottom surfaces, a semiconductor device integrally formed on or in the first top surface, and first bond pads at the first top surface electrically coupled to the semiconductor device), forming one or more trenches into the first top surface, forming a plurality of conductive traces each having a first portion electrically connected to one of the first bond pads, a second portion extending over and insulated from the first top surface, and a third portion extending down into one of the one or more trenches, providing a second substrate (which includes second top and second bottom surfaces, second bond pads at the second top surface, third bond pads at the second bottom surface, and conductors electrically coupled to the second bond pads and to the third bond pads), securing the first bottom surface to the second top surface, and electrically connecting each of a plurality of wires between one of the third portions of one of the plurality of conductive traces and one of the second bond pads.

Other objects and features of the present invention will become apparent by a review of the specification, claims and appended figures.

BRIEF DESCRIPTION OF THE DRAWINGS

FIGS. 2A-2I are side cross sectional views illustrating the steps in forming the packaged chip assembly of the present invention.

FIGS. 5A-5M are side cross sectional views illustrating the steps in forming an alternate embodiment of the packaged chip assembly of the present invention.

DETAILED DESCRIPTION OF THE INVENTION

The present invention is a packaged chip assembly that offers substantial thickness advantages over existing packaging solutions. The overall package height can be reduced by optimizing bond wire loop height through an improved fan-out package structure and a modification to the die geometry.

Figure 1:
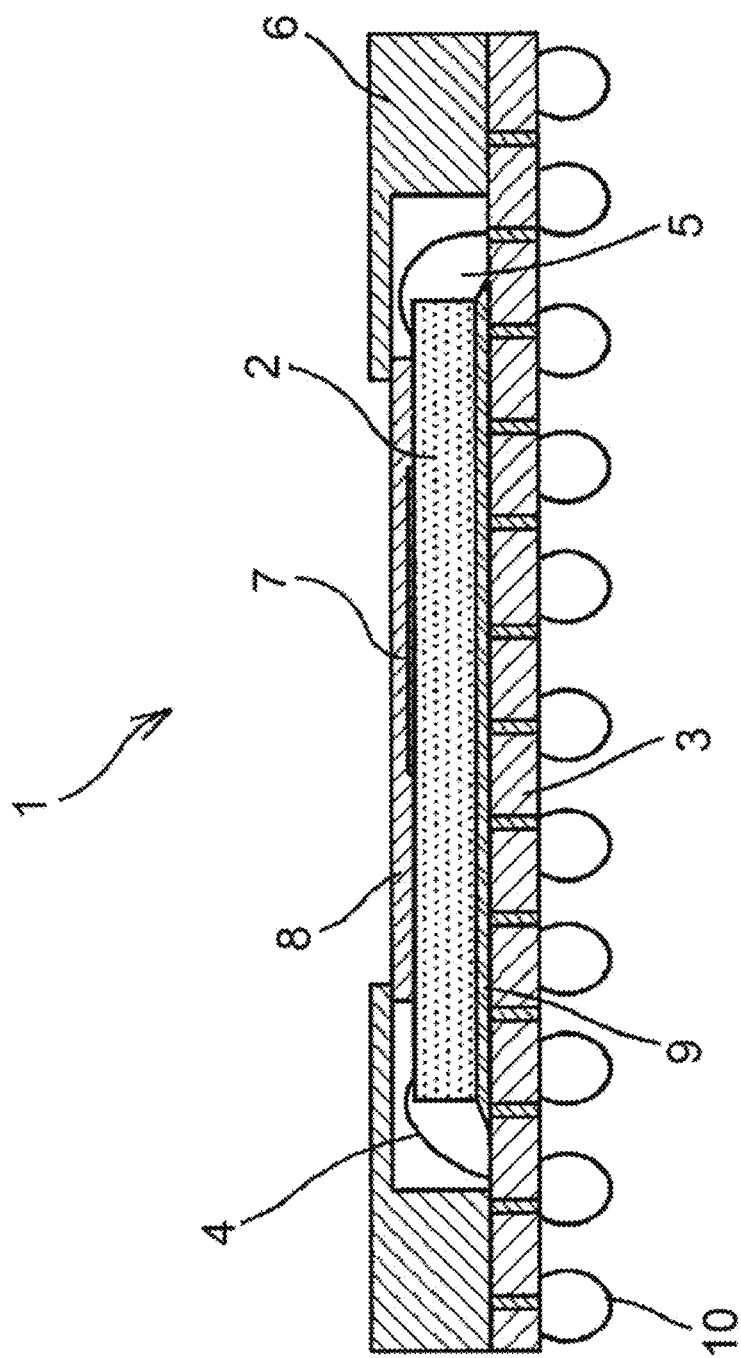
FIG. 1 is a side cross sectional view of a conventional semiconductor package.
Figure 2C:
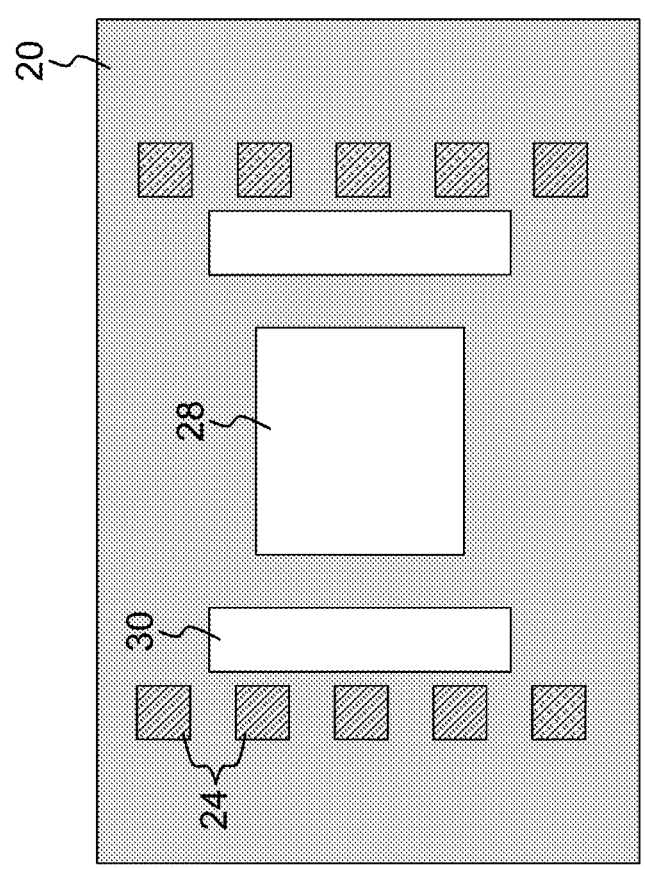

FIGS. 2A-2I illustrate the formation of the packaged chip assembly, which begins with fabricating or providing a fan out substrate 20, which can be made of rigid or flexible material such as ceramic, polyimide, FR4, BT, semiconductor silicon, glass, or any other well-known interposer substrate material. Substrate 20 can be single or multi-layer with at least one electrical routing layer containing electrical conductors 22. Layout/design of electrical conductors 22 can be random or pseudo-random, and largely dependent of the die layout/design. The electrical routing conductors 22 electrically connect wire bond pads 24 on the substrate's top surface to interconnect (bond) pads 26 on the substrate's bottom surface, as illustrated in FIG. 2A. If the substrate 20 is made of conductive material, then conductors 22 and pads 24/26 are insulated from the substrate material by an insulation material.

Figure 2D:
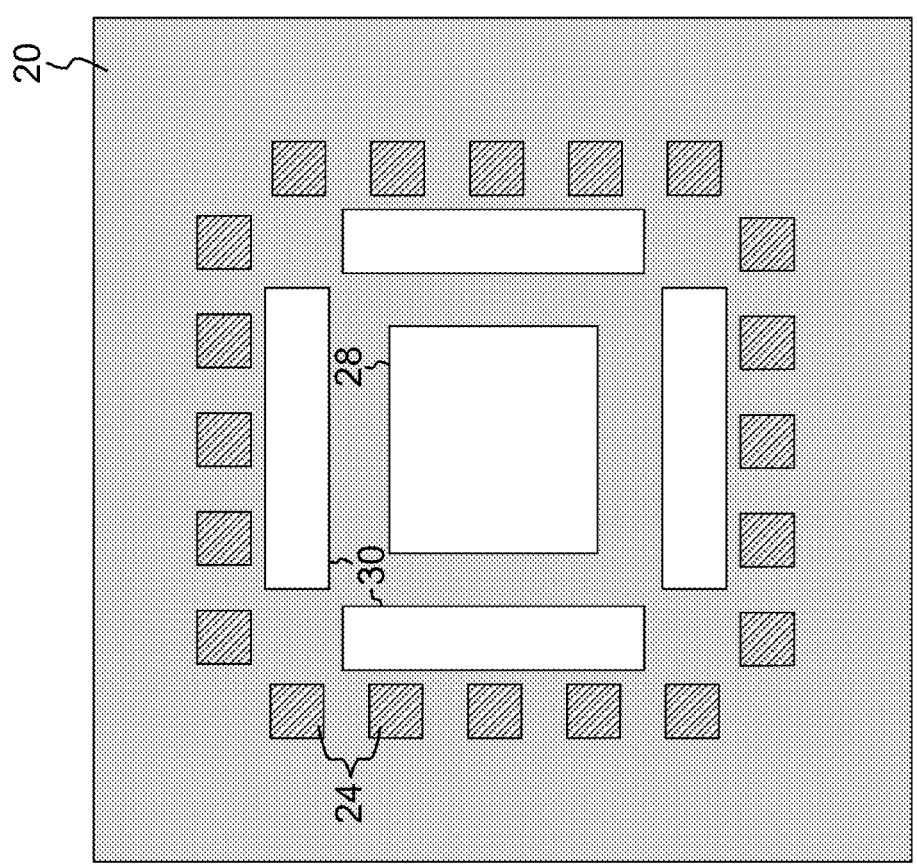

An active area aperture 28 is formed through substrate 20 (which will be aligned with the active area of the semiconductor chip discussed below). A plurality of bond pad apertures 30 are also formed through the substrate 20 (which will be aligned with the bond pads of the semiconductor chip discussed below). Preferably the apertures 28 and 30 do not impinge upon any of the conductors 22, wire bond pads 24 and interconnect pads 26, as illustrated in FIG. 2B. Apertures 28, 30 can be formed using a hole puncher, CNC router, etching or any other appropriate cutting method. The apertures 28, 30 can have tapered or vertical side walls. FIGS. 2C and 2D illustrate two different layout configurations for the apertures and pads of substrate 20. In each configuration, each bond pad aperture 30 will be aligned with multiple bond pads of the semiconductor chip.

Figure 2E:
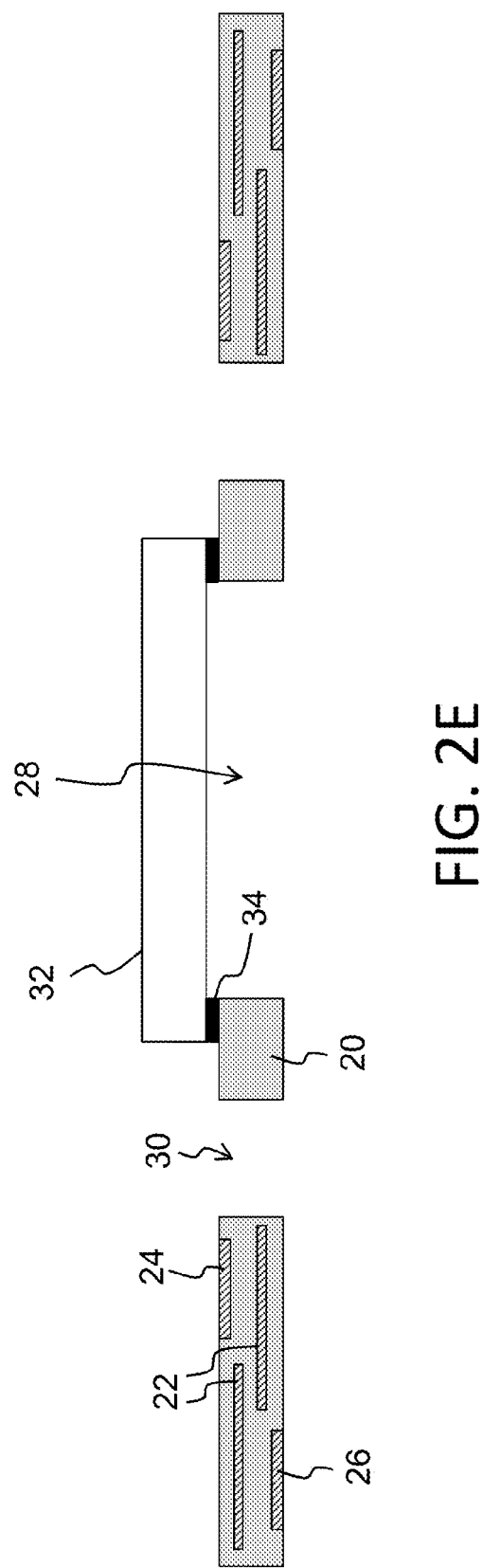

A substrate 32 is attached to the substrate 20 using adhesive 34. Substrate 32 extends over aperture 28, as illustrated in FIG. 2E. Substrate 32 can be optically transparent or semitransparent for semiconductor chips having optical active areas (discussed below). For such applications, substrate 32 can be a poly (methyl methacrylate), glass, sapphire, polycarbonate or any other transparent or semitransparent material. Preferably, the substrate is optically transparent glass. A preferred thickness of the substrate 32 is in range of 50 µm to 1000 µm. The substrate 32 can be coated with scratch and impact resistant coating, oleophobic resistant coating, one or more optical layers such as IR, AR or any other appropriate optical layers. Substrate 32 can be cut to the proper size (preferably slightly larger in size than aperture 28) by applying dicing tape over the substrate 32 (which protects the substrate 32 and holds it during the dicing process), and singulating the substrate using mechanical dicing, etching, laser or any other well-known singulation methods. The singulated substrate 32 can be detached from the dicing tape by UV deactivation and pick and place process. Adhesive 34 can be a polymer, epoxy, resin or any other appropriate bonding agent. For example, epoxy based adhesive material can be dispensed using a syringing system on to the substrate 32. A pick and place system can be used to place substrate 32 onto substrate 20.

Figure 2F:
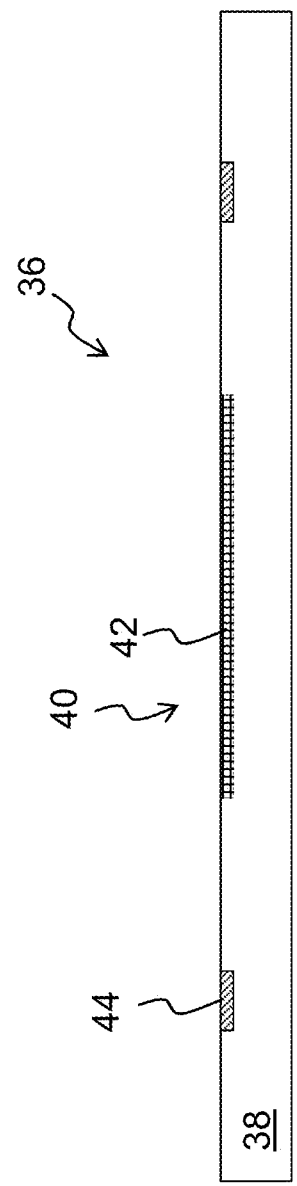

A semiconductor chip 36 is next provided, as shown in FIG. 2F. Chip 36 includes a semiconductor substrate 38, and an active area 40 at the substrate's upper (top) surface containing a semiconductor device 42 such as an image sensor, an infrared sensor, a light sensor, etc. Bond pads 44 at the substrate's top surface are directly or indirectly electrically coupled to the semiconductor device 42 (i.e. for off chip conductivity). The chip 36 can be made, for example, from a wafer containing multiple semiconductor devices 42, where dicing tape is applied over the top surface of the wafer after which the wafer can be thinned (from bottom surface etching—the wafer is preferably thinned to 150 µm or less) before the wafer is singulated into individual chips 36. Chips such as chip 36 are well known in the art and not further described herein.

Figure 2G:
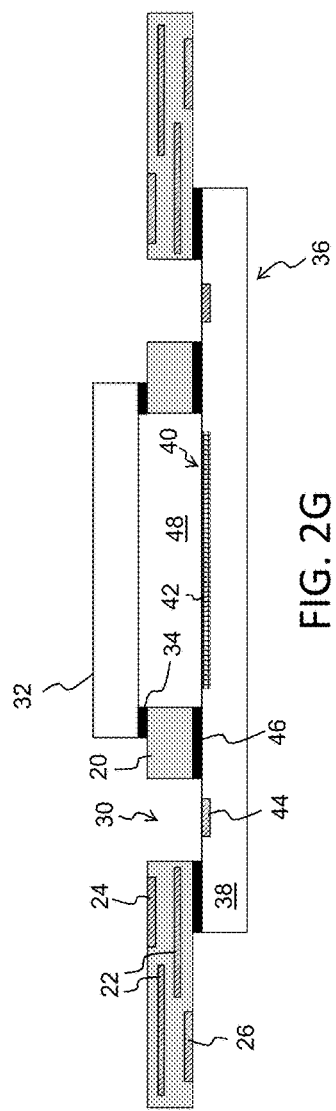

Adhesive 46 is then deposited on substrate 20 and/or substrate 38. Adhesive 46 can be polymer, epoxy, resin, die attach tape, or any other appropriate bonding agents or methods that are well known in the art. For example, epoxy based adhesive can be dispensed onto the substrate 20 using a syringing system. Chip 36 is picked and placed onto the substrate 20 by using pick and place process, whereby adhesive 46 secures the bottom surface of the substrates 20 to the top surface of chip 36 so that a hermetically sealed cavity 48 is formed between the active area 40 and substrate 32. The resulting structure is shown in FIG. 2G.

Figure 2H:
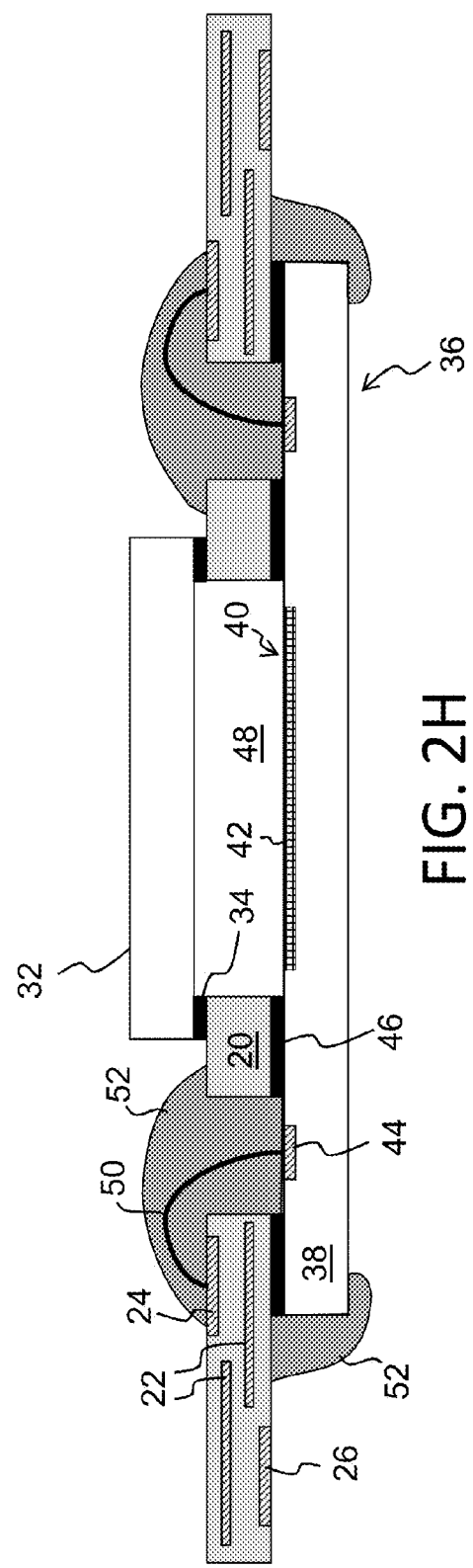
Figure 21:
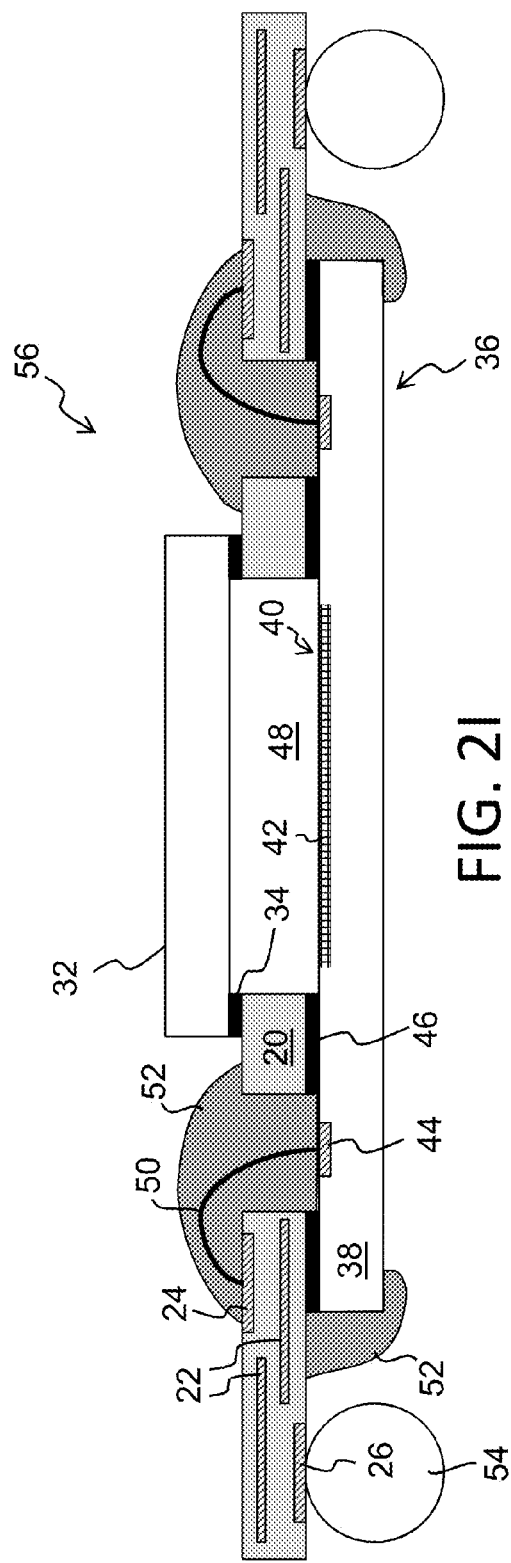

Wires 50 are used to connect the chip 36 to the substrate 20 as shown in FIG. 2H. Specifically, each wire 50 has one end connected to one of the bond pads 24 (of substrate 20) and the other end connected to one of the bond pads 44 (of the chip 36). These connections provide the signals from device 42 to conductors 22 and on to interconnect pads 26. A loop height (i.e. highest point of the looped wire 50 above the upper surfaces of substrates 20/38) is preferably lower than the top surface of substrate 32. Encapsulant 52 is then deposited over the wires 50 and bond pads 24/44. Preferably, the upper surface of encapsulant material 52 is higher than the loop height of the wires 50 yet lower than the top surface of the substrate 32. Preferably encapsulant 52 is also deposited over the perimeter of the chip substrate 38 and on the bottom surface of substrate 20. The purpose of the encapsulant 52 is to seal and protect the structure underneath. Interconnects 54 are then formed on the interconnect pads 26 of substrate 20. Interconnects 54 can be for example ball grid array (BGA), land grid array (LGA), or any other appropriate interconnect methods. BGA is one of the preferred interconnect types and is shown in the figures. BGA interconnects 54 can be formed on the substrate 20 by using a solder ball jetting process or solder ball drop process. The BGA interconnect 54 should extend down lower than the bottom surface of chip 36 and the encapsulant 52 thereon, to enable easy connection to BGA interconnect 54. The resulting packaged chip assembly 56 is shown in FIG. 2I.

Figure 3A:
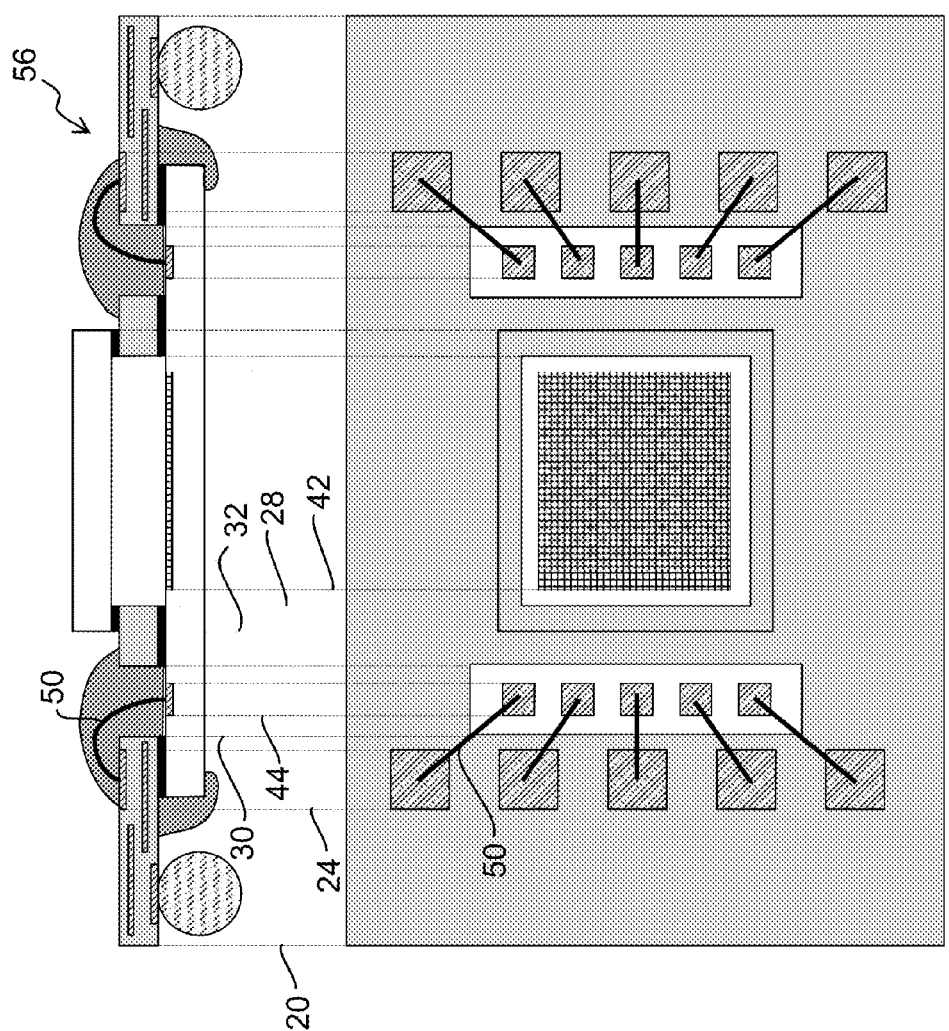
FIG. 3A illustrates the correlation of elements of the packaged chip assembly as viewed from side and top cross sectional directions.
Figure 3B:
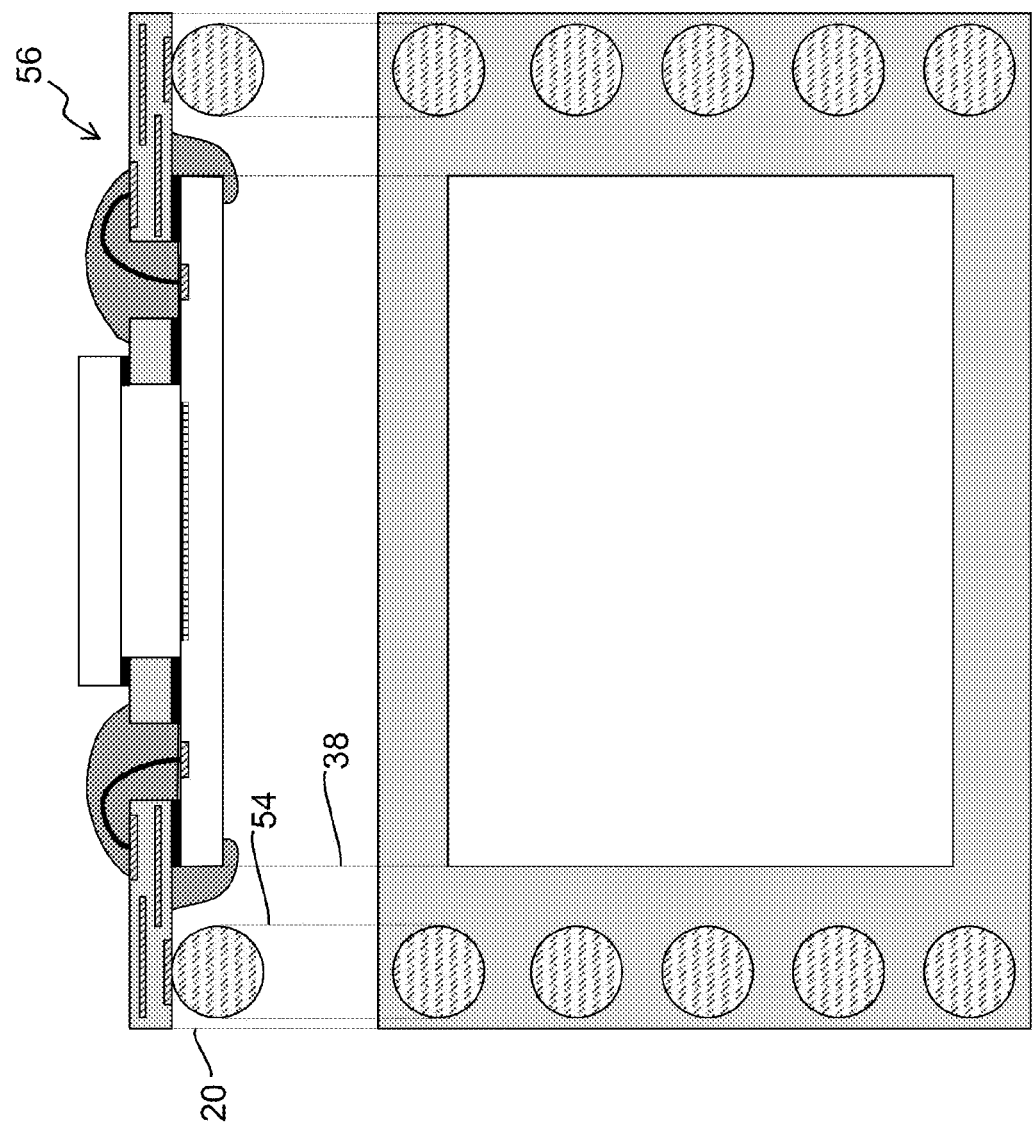
FIG. 3B illustrates the correlation of elements of the packaged chip assembly as viewed from side and bottom cross sectional directions.
Figure 4:
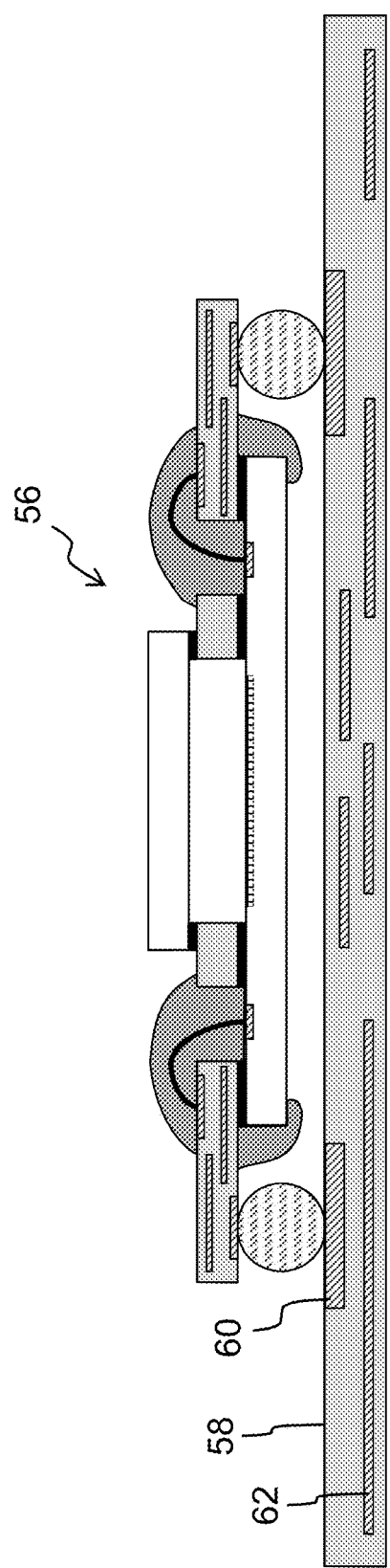
FIG. 4 is a side cross sectional view illustrating the package chip assembly mounted to a host substrate.

FIG. 3A shows the correlation of elements of the packaged chip assembly 56 as viewed from side and top cross sectional views. FIG. 3B shows the correlation of elements of the packaged chip assembly 56 as viewed from the side and the bottom. FIG. 4 shows the packaged chip assembly 56 mounted to a host substrate 58 (e.g. using an SMT process). The host substrate 58 can be a rigid or flexible printed circuit board or any other type of host substrate having contact pads 60 (in electrical contact with interconnects 54 and conductors 62).

With the packaged chip assembly 56, the semiconductor chip 36 is attached to the substrate 20, whereby the chip's electrical signals on contact pads 44 are routed via wires 50 to bond pads 24, through conductors 22, to interconnect pads 26 and interconnects 54 connected thereto. Substrate 20 includes apertures 30 for leaving the bond pads 44 of chip 36 exposed for allowing the wire bonding process. The substrate 20 also includes the active area aperture 28 for leaving the active area 40 of chip 36 exposed for allowing the active area 40 (and the semiconductor device 42 therein) to receive light or other sensed energy. The substrate 32 is attached over the topside of substrate 20, therefore hermetically sealing and protecting the chip active area 40. The substrate 20 has interconnects 26 on the bottom side for mounting the package chip assembly 56 to host substrate 58. Because the chip 36 is bonded to the bottom side of the substrate 20 taking up part of the space that is normally wasted when mounting the assembly to a host substrate using interconnects such as BGA, substantial height reduction can be achieved. Further, the bond wires 50 pass through the substrate 20, therefore reducing the height profile even more in comparison to existing packaging solutions. This structure is especially ideal for image sensors, IR sensors, light sensors or any other optical related sensors.

Figure 5A:
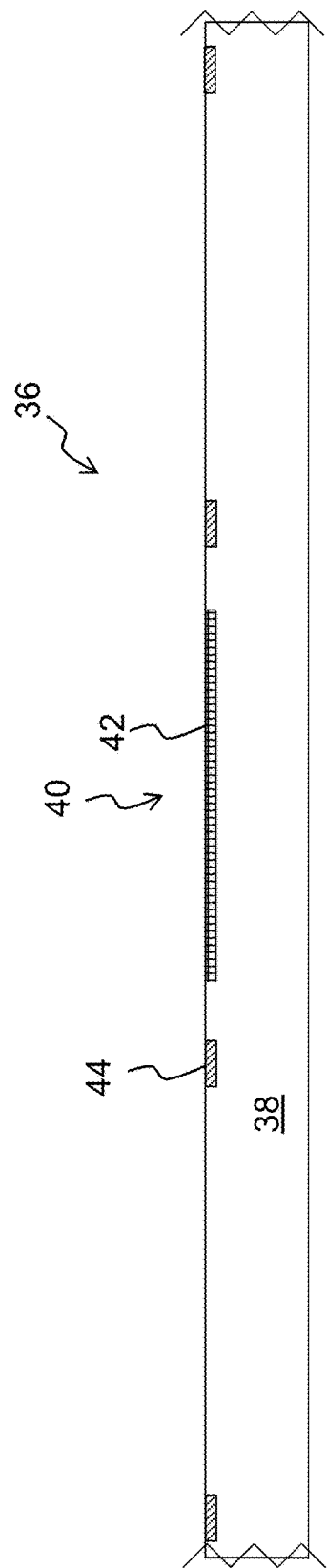

FIGS. 5A-5M illustrate the formation of an alternate embodiment of the packaged chip assembly. Comparable or similar components will be indicated with the same element numbers. The formation begins with the provision of semiconductor chip 36 discussed above except while still in wafer form (i.e. a plurality of chips 36 formed on a single wafer substrate 38, after optional thinning, and before singulation), as illustrated in FIG. 5A. Photoresist 70 is deposited on the active side of the substrate 38, covering the active area 40 and the bond pads 44. Photoresist 70 can be deposited with spin coating, spray coating, dry film or any other appropriate photoresist deposition method. Photoresist 70 is developed (i.e. exposed and selectively removed using a photolithographic exposure and etch process) which patterns the photoresist to expose the silicon substrate 38 between two adjacent dies (but without exposing the active areas 40 and bond pads 44), as shown in FIG. 5B.

Figure 5C:
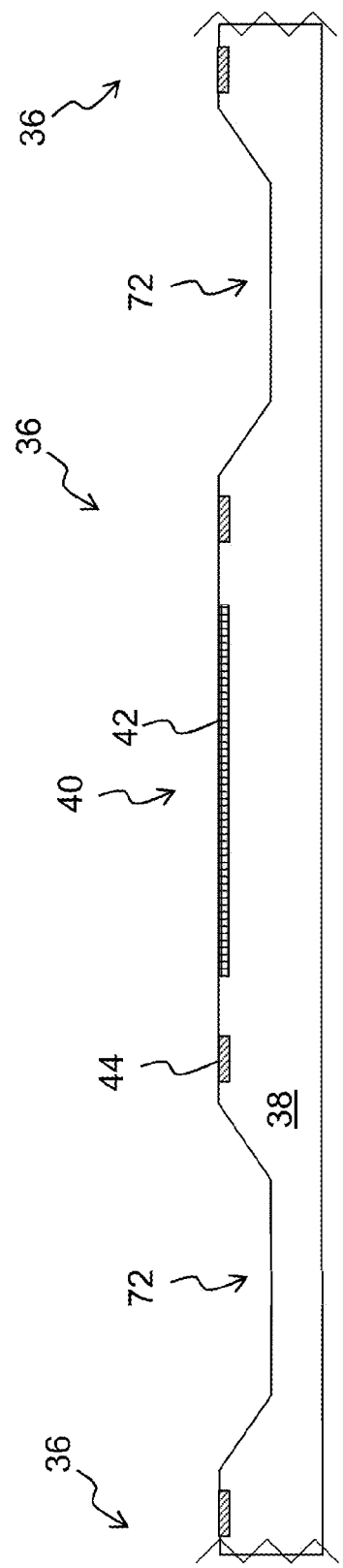

The exposed portions of substrate 38 are etched using an anisotropic dry etch to form trenches 72 into the top surface of substrate 38. The enchant can be for example CF4, SF6 or any other appropriate etchant. The walls of trench 72 preferably, but not necessarily, are tapered. Trenches 72 can be formed on all four sides, three sides, two sides or a single side of the active area 40 and its associated bond pads 44. Preferably, the depth of trenches 72 do not exceed 75% of the vertical height of substrate 38. FIG. 5C shows the resulting structure, after photoresist 70 is removed.

Figure 5D:
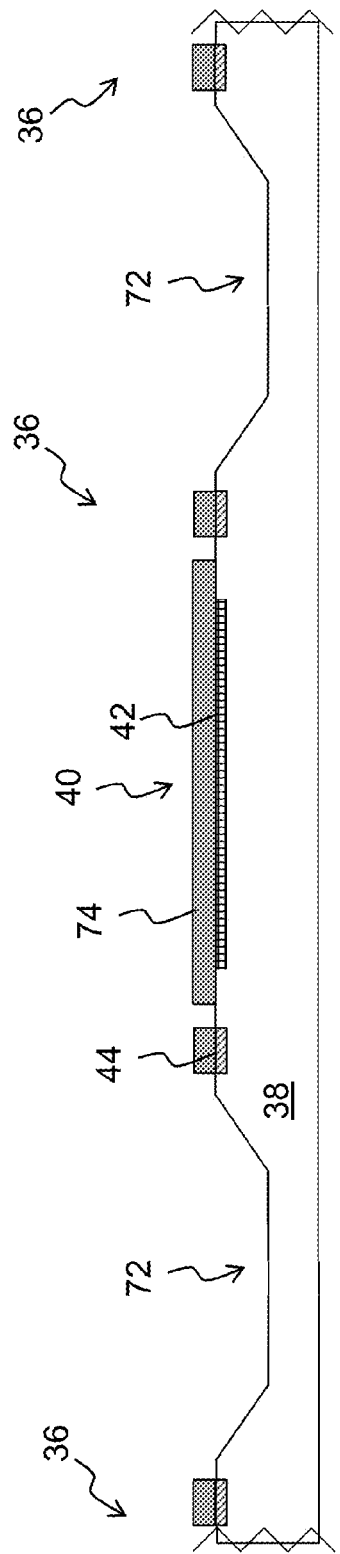

Photoresist 74 is then deposited on the active side of the substrate 38, and is developed (i.e. exposed and selectively removed) which patterns the photoresist 74 to expose the silicon substrate 38 (but leaving photo resist 74 disposed just over the active areas 40 and bond pads 44 and not the areas in-between), as shown in FIG. 5D. Passivation (i.e. insulation material) 76 is deposited on the structure. The passivation 76 can be silicon dioxide, silicon nitride, titanium, a combination of aforementioned passivation or any other appropriate silicon passivation electrical insulation material. Passivation 76 can be and preferably is deposited using physical vapor deposition (PVD). The resulting structure is shown in FIG. 5E (after removal of photoresist 74).

Figure 5F:
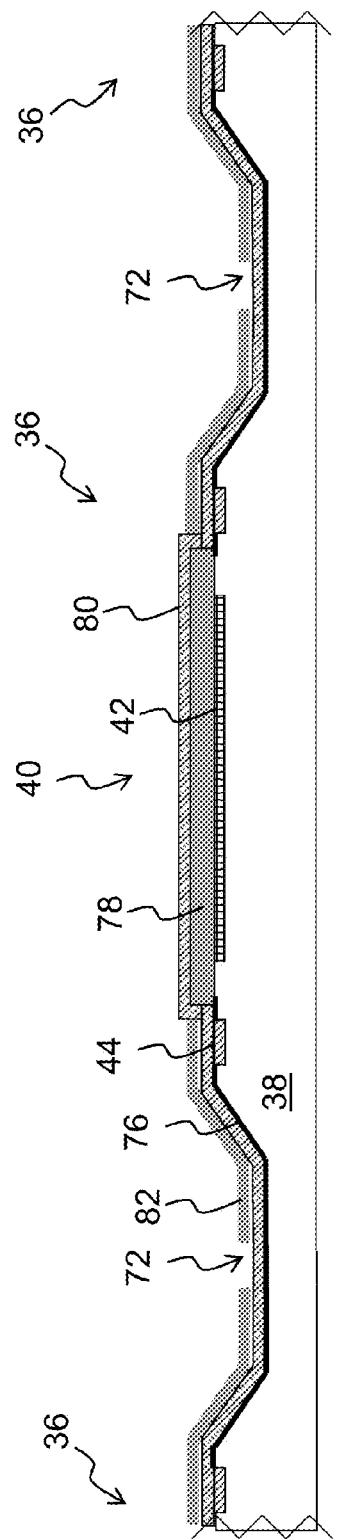
Figure 5G:
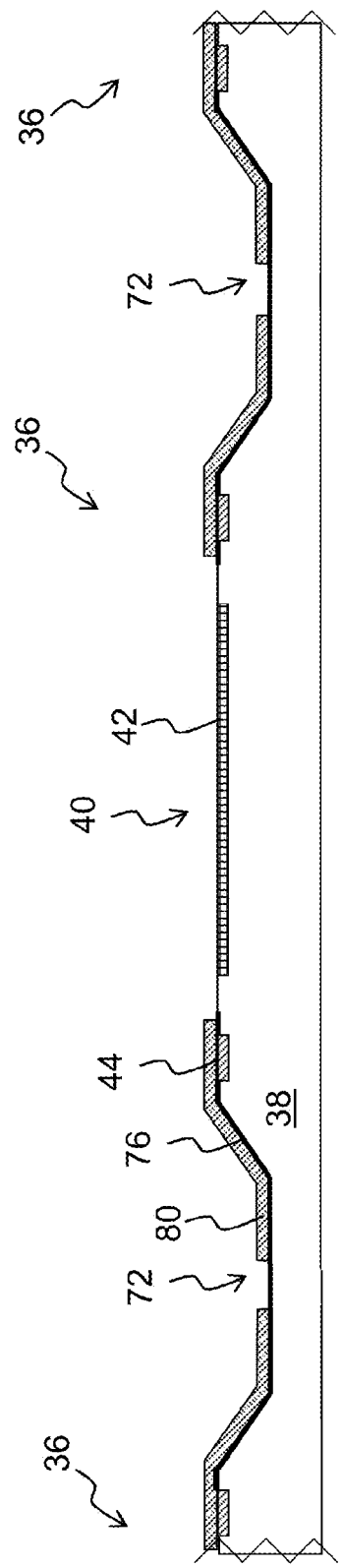

Photoresist 78 is then deposited on the active side of the semiconductor device wafer, and is developed (i.e. exposed and selectively removed) leaving photoresist 78 only over the active areas 40. A layer of electrically conductive material 80 is deposited over the passivation layer 76 and photoresist 78. The conductive material layer 80 can be copper, aluminum or any other appropriate conductive material(s), and can be deposited using physical vapor deposition (PVD), plating or any other appropriate deposition method(s). Preferably, the electrically conductive material layer 80 is copper and is deposited by sputtering and then plating. Photoresist 82 is then deposited over conductive layer 80, and is developed (i.e. exposed and selectively removed) leaving photoresist 82 intact except for over the active areas 40 and at or near the centers of trenches 72, as shown in FIG. 5F. An etch is then used to remove the exposed portions of conductive layer 80, leaving traces 80 of the conductive material each extending from one of the bond pads 44 down into one of the trenches 72, as shown in FIG. 5G (after photoresist 82 and 78 are removed). Traces 80 are in electrical contact with bond pads 44, but are insulated from substrate 38 by passivation layer 76, thus electrically routing the bond pads 44 into trenches 72.

Figure 5H:
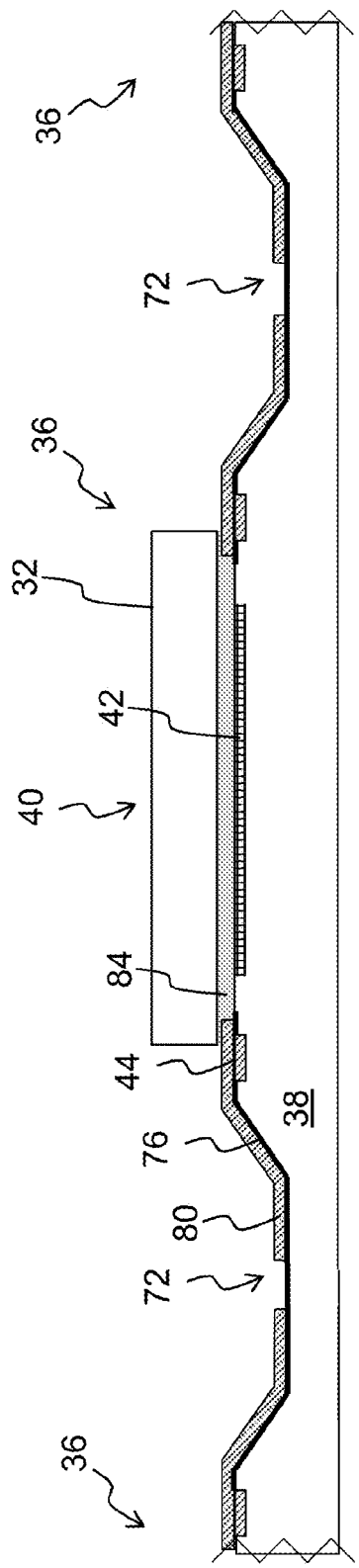

Substrate 32 is attached directly over the active area 40, as shown in FIG. 5H. As stated above, substrate 32 can be a poly (methyl methacrylate), glass, sapphire, polycarbonate or any other appropriate material, can be optically transparent or semitransparent, and can be treated with scratch and impact resistant coating, oleophobic resistant coating, one or more optical layers such as IR, AR or any other appropriate optical layers. Substrate 32 is attached using a bonding adhesive 84 which can be optically transparent/semitransparent. Adhesive 84 can be deposited either on the active area 40 or on the substrate 32 using a syringing deposition process, and then the substrate 32 is directly attached to the active area 40. There is no gap or cavity between substrate 32 and active area 40 as in the previously described embodiment.

Given the direct mounting of the substrate 32 to the active area 40, substrate 32 can be sapphire, and more specifically multiple sheets of single crystal sapphire layered in different crystal plane orientations. The many layers of sapphire sheets are bonded using fusion, adhesion or any other appropriate bonding techniques. Optionally, the multilayer sapphire substrate 32 can contain a conductive grid, a conductive mesh, or a suspended conductive particle layer. This conductive layer can be connected to a grounding element to prevent electrostatic discharge (ESD) damage to the semiconductor device 42. This conductive layer can also be designed to enhance the thermal dissipation rate of the device. Sapphire can be desirable because of its hardness, durability and scratch resistance. These strengths can be enhanced when sheets of sapphire are stacked in different plane orientation.

Because of these strengths, the silicon die can be better protected from physical forces such as a finger press. The superior strength of sapphire allows it to be thinner than other materials such as glass. The sapphire substrate thickness can be 100 μm to 1000 μm and still provide sufficient protection to the chip 36. The thinner sapphire allows for an overall thinner device, and allows the active area 40 to be more sensitive. This can be especially important where the semiconductor device 42 is a capacitive sensor used for fingerprint recognition, where the closer the finger to the active area 40 the better. Sapphire is preferably singulated using a laser-cutting process before mounting to the chip 36.

Figure 5I:
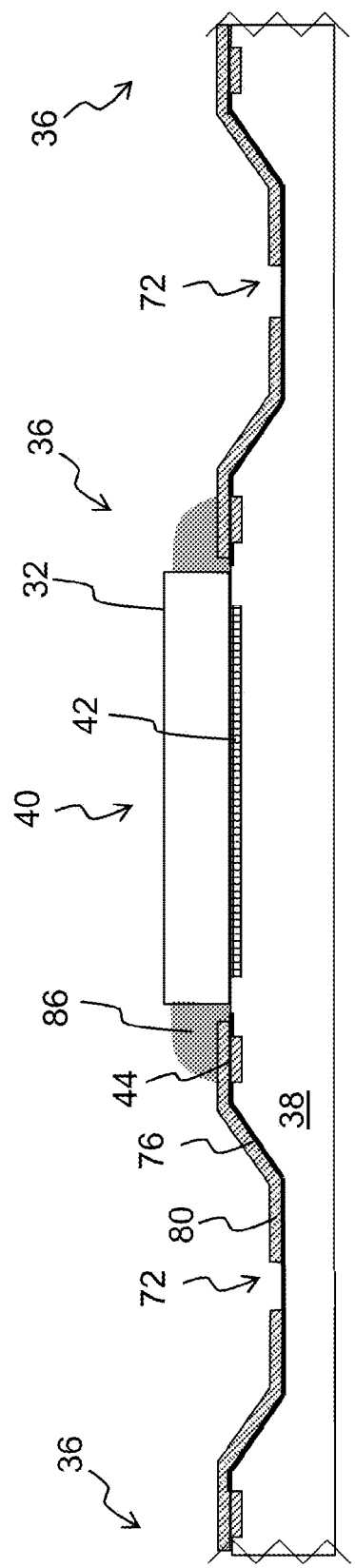

FIG. 5I shows an alternate embodiment for mounting substrate 32 onto chip 36, where no adhesive is deposited between substrate 32 and the active area 40 of chip 36, which would improve the active area sensitivity, reduce optical or tactile loss, and reduce overall device height. The substrate 32 is attached at its sides with encapsulant/adhesive material 86 deposited by syringing method, preferably deposited under vacuum. The material 86 is preferably lower than the top surface of the substrate 32.

Figure 5K:
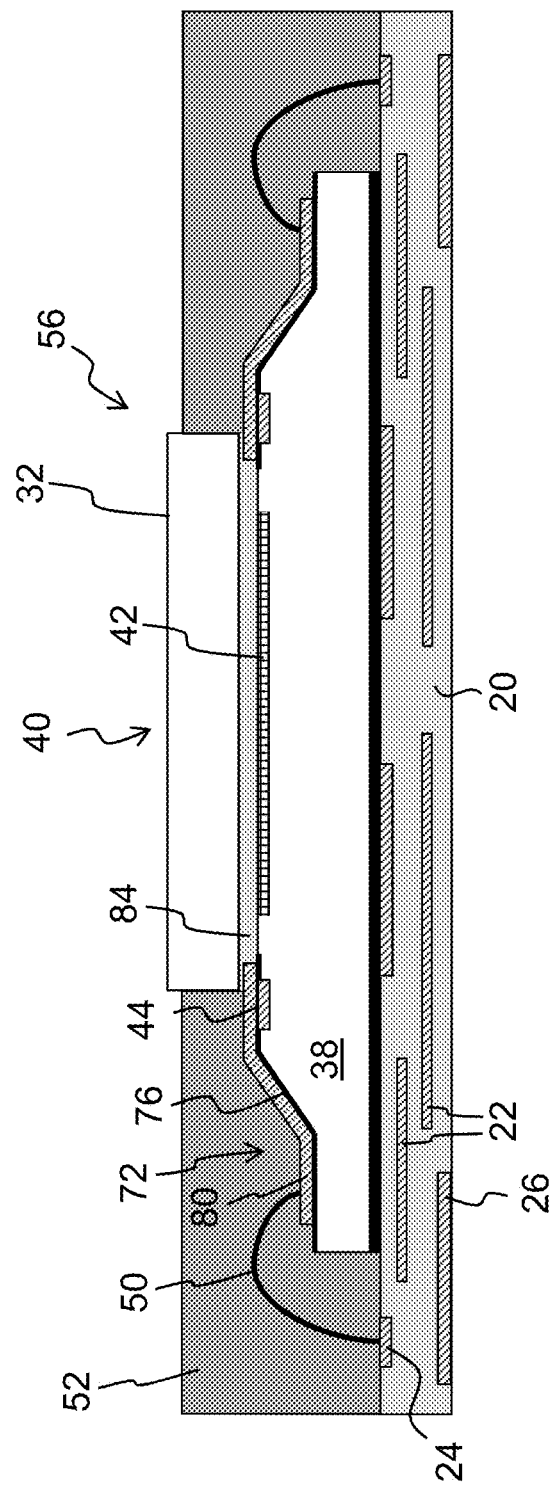

Wafer level dicing/singulation is then performed along scribe lines 88 that pass through trenches 72, resulting in individual semiconductor chips 36 as shown in FIG. 5J. Singulation can be performed by mechanical dicing, laser cutting, chemical etching or any other appropriate processes. The singulated chip 36 is then bonded to the top surface of the substrate 20 discussed above, but in this embodiment substrate 20 does not contain the apertures 28 and 30 and chip 36 is not bonded to the bottom surface of substrate 20. Wires 50 are used to connect the chip 36 to the substrate 20. Specifically, each wire 50 has one end connected to one of the bond pads 24 (of substrate 20) and the other end connected to one of the traces 80 (of the chip 36) in one of the trenches 72. These connections provide the signals from device 42, through bond pads 42, traces 80, wires 50, bond pads 24, conductors 22 and on to interconnect pads 26. A loop height (i.e. highest point of the looped wire 50) is preferably lower than the top surface of substrate 32. The loop height can be made lower given the depth of trenches 72 (as compared to having to run wires 50 from bond pads 44 and/or any portion of the traces 80 running along the top surface of substrate 38). Encapsulant 52 is then deposited over the wires 50, bond pads 24 and traces 80. Preferably, the top surface of the encapsulant material 52 is lower than the top surface of the substrate 32, but higher than the peak height of the wires 50 by a certain amount (e.g., 5μm), as shown in FIG. 5K. Encapsulant 52 can be deposited using syringing, injection molding or any other appropriate encapsulation processes that are well known in the art. Preferably, the deposition method is injection molding.

Figure 5L:
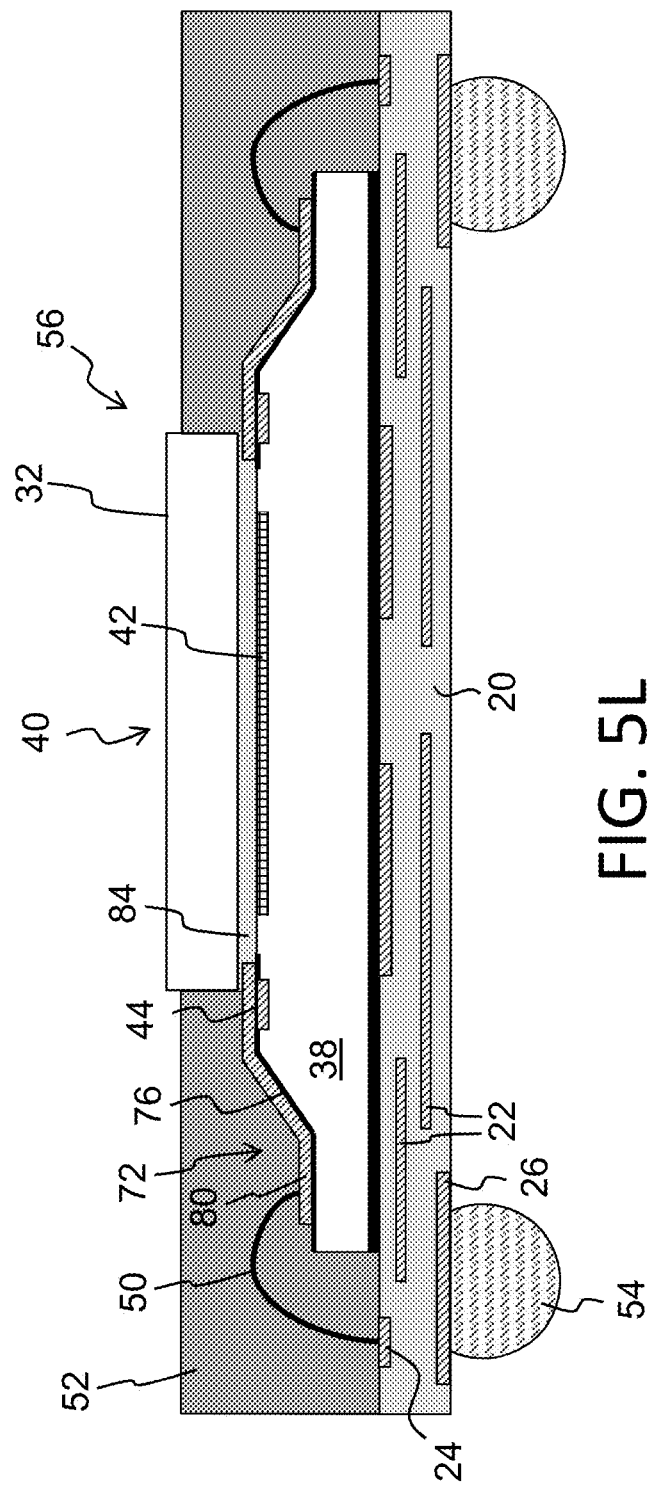
Figure 5M:
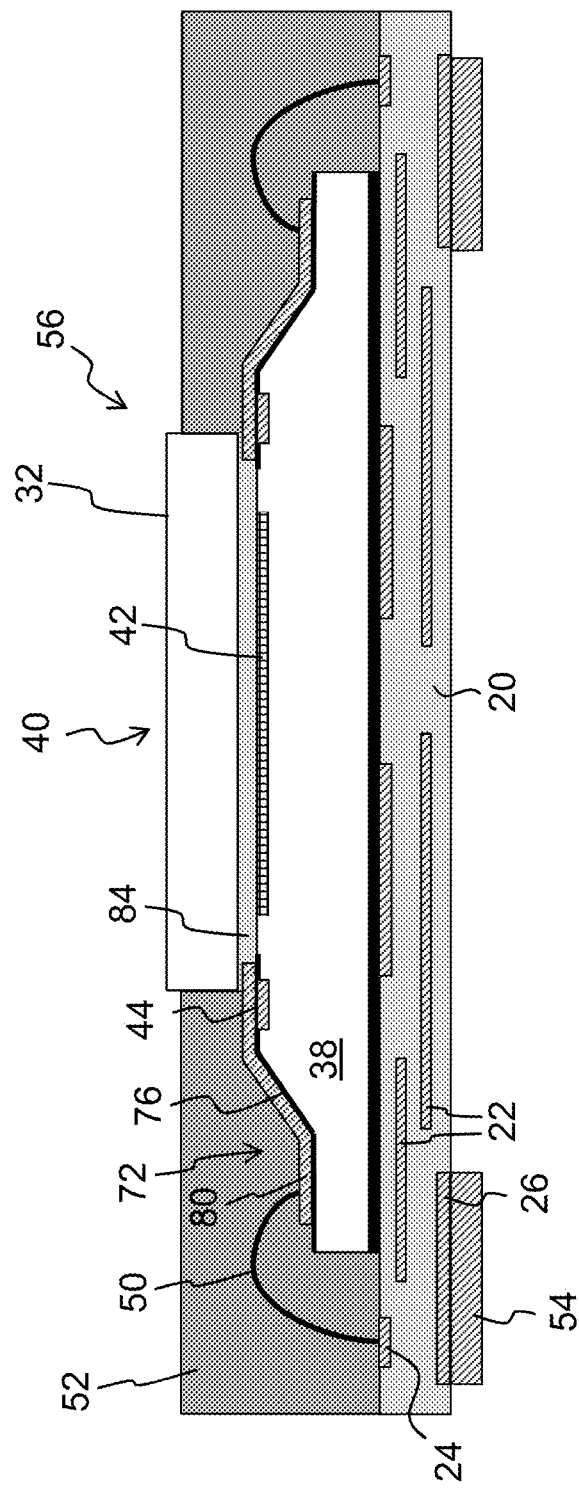
Figure 6:
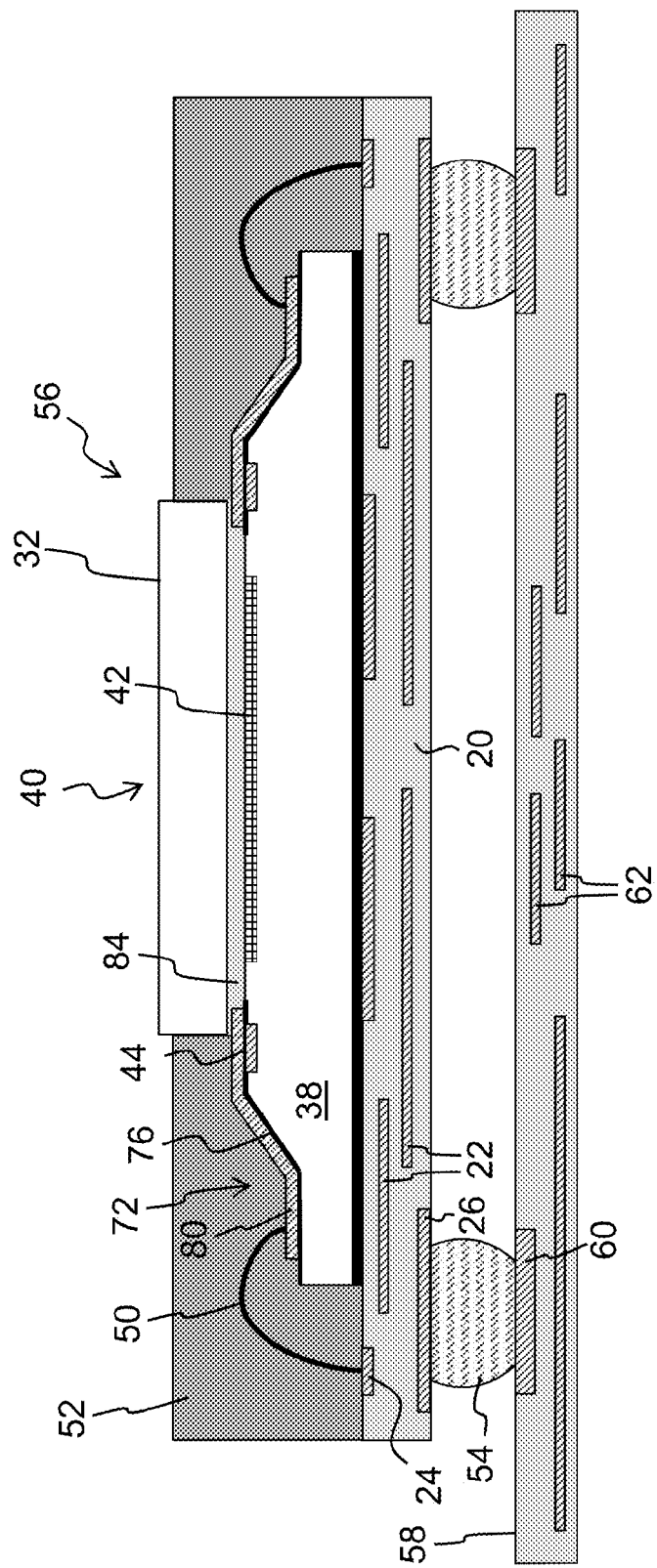
FIG. 6 is a side cross sectional view illustrating the alternate embodiment of the package chip assembly mounted to a host substrate.
Figure 7:
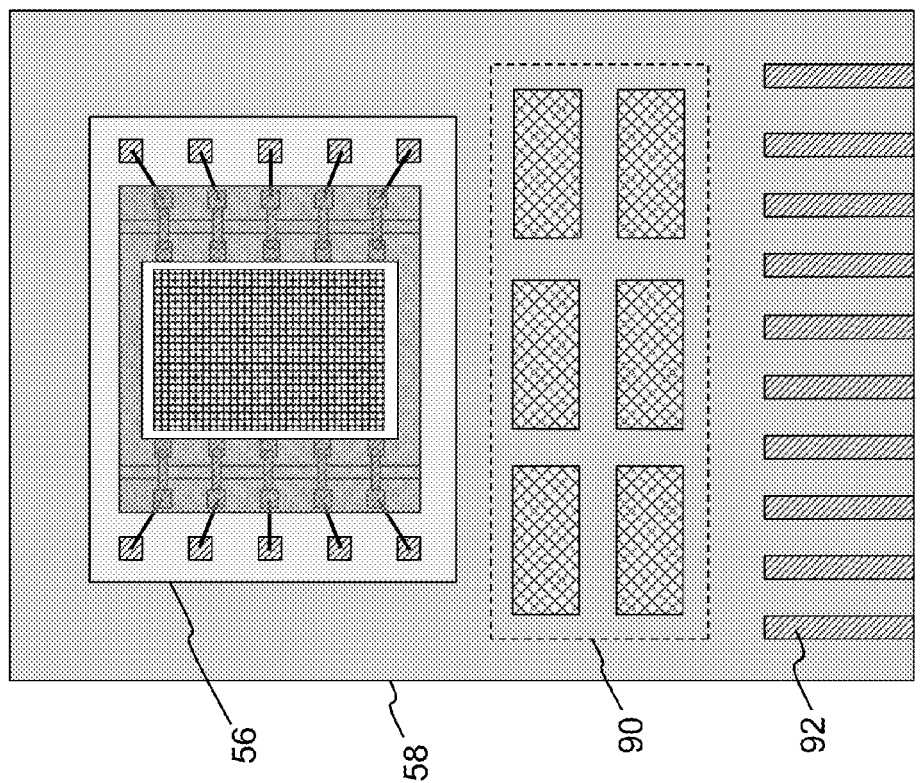
FIGS. 7 and 8 are top views illustrating the alternate embodiment of the package chip assembly mounted to a host substrate.
Figure 8:
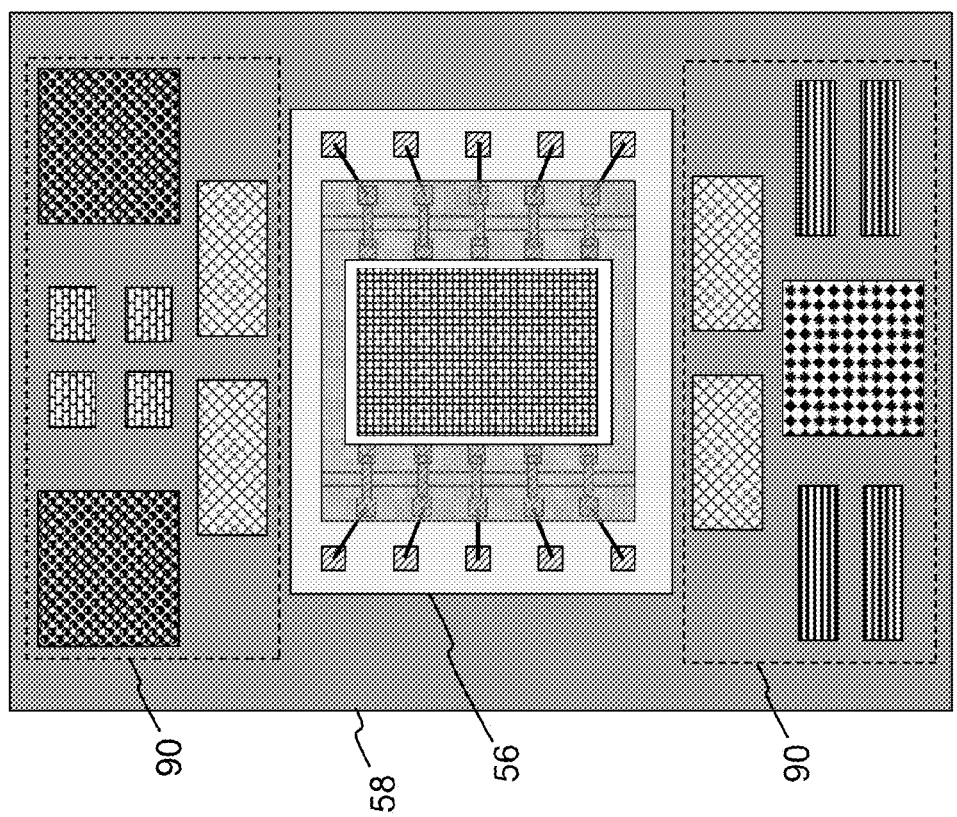

Interconnects 54 are then formed on the interconnect pad 26 of substrate 20. Interconnects 54 can be for example gall grid array (BGA) as shown in FIG. 5L, land grid array (LGA) as shown in FIG. 5M, or any other appropriate interconnect technique. The packaged chip assembly 56 is then mounted on host substrate 58 (e.g. using an SMT process), as shown in FIG. 6. FIGS. 7 and 8 show examples of other components that can be mounted/connected to the host substrate 58, including electrical devices 90 such as processors, memory, capacitors, etc., and connectors 92 for the substrate 58. This embodiment structure is ideal for biometric identification semiconductor devices given the contact of the substrate 32 and semiconductor device 42 (either directly or via adhesive 84).

Figure 9:
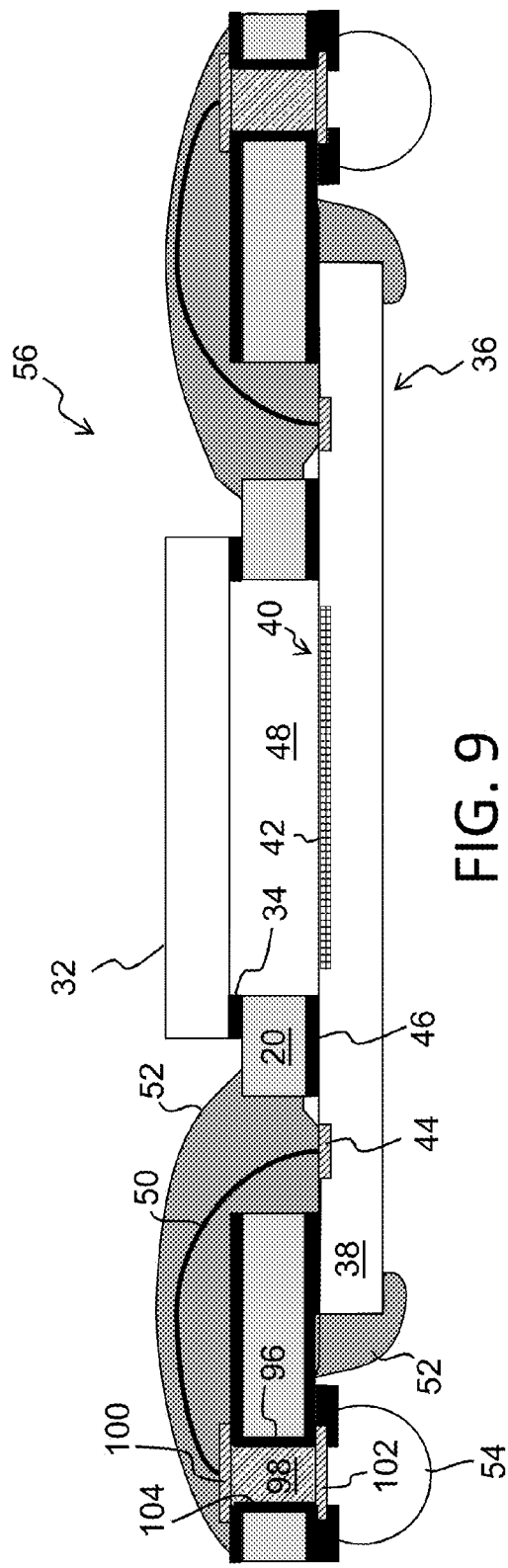
FIG. 9 is a side cross sectional view illustrating the alternate embodiment of the package chip assembly mounted to a host substrate.

FIG. 9 illustrates an alternate embodiment to that shown in FIG. 2I. Instead of substrate 20 including electrical routing conductors 22 therein (for electrically connecting wire bond pads 24 on the substrate's top surface to interconnect (bond) pads 26 on the substrate's bottom surface), substrate 20 could be made of a solid material such a conductive semiconductor material or a glass material. The substrate 20 in this embodiment includes holes 96 that extend between the top and bottom surfaces of substrate 20. Conductive material is deposited in holes 96 to form electrical interconnects 98 that extend through substrate 20. Wires 50 connect to the electrical interconnects 98 near the top surface of substrate 20 (either directly or using bond pads 100), and interconnects 54 connect to the electrical interconnects 98 near the bottom surface of the substrate (either directly or using bond pads 102).

The electrical interconnects 98 are insulated from the substrate 20 by a layer of compliant dielectric material 104. A compliant dielectric is a relatively soft material (e.g. solder mask) that exhibits compliance in all three orthogonal directions, and can accommodate the coefficient of thermal expansion (CTE) mismatch between a substrate material such as semiconductor crystalline (~2.6 ppm/° C.) and interconnect material such as Cu (~17 ppm/° C.). Compliant dielectric material 104 is preferably a polymer, such as BCB (Benzocyclobutene), solder mask, solder resist, FR4, mold compound, or BT epoxy resin. The compliant dielectric material 104 serves to electrically insulate the electrical interconnects 98 from the substrate 20 in the case where substrate 20 is made of a conductive semiconductor material (so the two do not electrically short together). Compliant dielectric material 104 serves to reduce metal stresses on the substrate 20 in the case where substrate 20 is made of glass.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged chip assembly of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a packaged chip assembly, comprising:
    providing a semiconductor chip that includes:
        a first substrate of semiconductor material having first top and first bottom surfaces,
        a semiconductor device integrally formed on or in the first top surface, and
        first bond pads at the first top surface electrically coupled to the semiconductor device;
    providing a second substrate that includes:
        second top and second bottom surfaces,
        a first aperture extending between the second top and second bottom surfaces,
        one or more second apertures extending between the second top and second bottom surfaces,
        second bond pads at the second top surface,
        third bond pads at the second bottom surface, and
        conductors electrically coupled to the second bond pads and the third bond pads;
    securing the first top surface to the second bottom surface such that the semiconductor device is aligned with the first aperture, and each of the first bond pads is aligned with one of the one or more second apertures; and
    electrically connecting each of a plurality of wires between one of the first bond pads and one of the second bond pads, wherein each of the plurality of wires passes through one of the one or more second apertures.

2. The method of claim 1, further comprising:
    securing a third substrate to the second top surface, wherein the third substrate covers the first aperture and is optically transparent or semitransparent, and wherein the semiconductor device is one of an image sensor, an infrared sensor, and a light sensor.

3. The method of claim 1, further comprising:
covering the wires with, and filling the one or more second apertures with, encapsulant.

4. The method of claim 1, further comprising:
providing a third substrate that includes:
   third top and third bottom surfaces, and
   fourth bond pads at the third top surface; and
securing the third top surface to the second bottom surface using electrical interconnects that are each electrically coupling one of the third bond pads to one of the fourth bond pads.

5. A method of forming a packaged chip assembly, comprising:
providing a semiconductor chip that includes:
   a first substrate of semiconductor material having first top and first bottom surfaces,
   a semiconductor device integrally formed on or in the first top surface, and
   first bond pads at the first top surface electrically coupled to the semiconductor device;
forming one or more trenches into the first top surface;
forming a plurality of conductive traces each having a first portion electrically connected to one of the first bond pads, a second portion extending over and insulated from the first top surface, and a third portion extending down into one of the one or more trenches;
providing a second substrate that includes:
   second top and second bottom surfaces,
   second bond pads at the second top surface,
   third bond pads at the second bottom surface, and
   conductors electrically coupled to the second bond pads and to the third bond pads;
securing the first bottom surface to the second top surface;
electrically connecting each of a plurality of wires between one of the third portions of one of the plurality of conductive traces and one of the second bond pads;
providing a third substrate that includes:
   third top and third bottom surfaces, and
   fourth bond pads at the third top surface; and
securing the third top surface to the second bottom surface using electrical interconnects that are each electrically coupling one of the third bond pads to one of the fourth bond pads.

6. The method of claim 5, further comprising:
securing a fourth substrate to the first top surface, wherein the fourth substrate is disposed over the semiconductor device.

7. The method of claim 6, wherein the fourth substrate comprises multiple sheets of single crystal sapphire layered in different crystal plane orientations.

8. The method of claim 5, further comprising:
covering the wires and the conductive traces with encapsulant.

* * * * *